(12) United States Patent
Kiritani

(10) Patent No.: US 6,844,624 B1
(45) Date of Patent: Jan. 18, 2005

(54) MULTICHIP MODULE

(75) Inventor: Masahide Kiritani, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/732,521

(22) Filed: Dec. 11, 2003

(30) Foreign Application Priority Data

Jun. 26, 2003 (JP) ........................................ 2003-182022

(51) Int. Cl.[7] .......................................... H01L 23/34
(52) U.S. Cl. ............................... 257/723; 257/724
(58) Field of Search ......................... 257/48, 723, 724, 257/777, 686, 784

(56) References Cited

U.S. PATENT DOCUMENTS

| | | | | |
|---|---|---|---|---|
| 5,612,946 A | * | 3/1997 | Kanekawa et al. | 370/216 |
| 5,771,194 A | * | 6/1998 | Maeno | 365/200 |
| 5,973,392 A | * | 10/1999 | Senba et al. | 257/686 |
| 6,426,560 B1 | * | 7/2002 | Kawamura et al. | 257/777 |
| 6,531,773 B2 | * | 3/2003 | Nishizawa et al. | 257/723 |
| 6,696,714 B2 | * | 2/2004 | Hayashi et al. | 257/296 |
| 6,738,914 B2 | * | 5/2004 | Christopher | 713/323 |

FOREIGN PATENT DOCUMENTS

JP    2000-22072    1/2000

* cited by examiner

*Primary Examiner*—S. V. Clark
(74) *Attorney, Agent, or Firm*—Oblon, Spivak, McClelland, Maier & Neustadt, P.C.

(57) ABSTRACT

A selector has the first input terminal to which a test signal is given, the second input terminal connected to an output terminal of the first internal logic circuit, and an output terminal connected via a wiring to an input terminal of the second internal logic circuit. Another selector has an input terminal connected to the wiring, another input terminal connected to an output terminal of the second internal logic circuit, and an output terminal connected via another wiring to a signal input terminal of the second internal logic circuit. Each of the selectors selectively outputs a signal given to its first input terminal or a signal given to its second input terminal B based on a test mode signal.

19 Claims, 12 Drawing Sheets

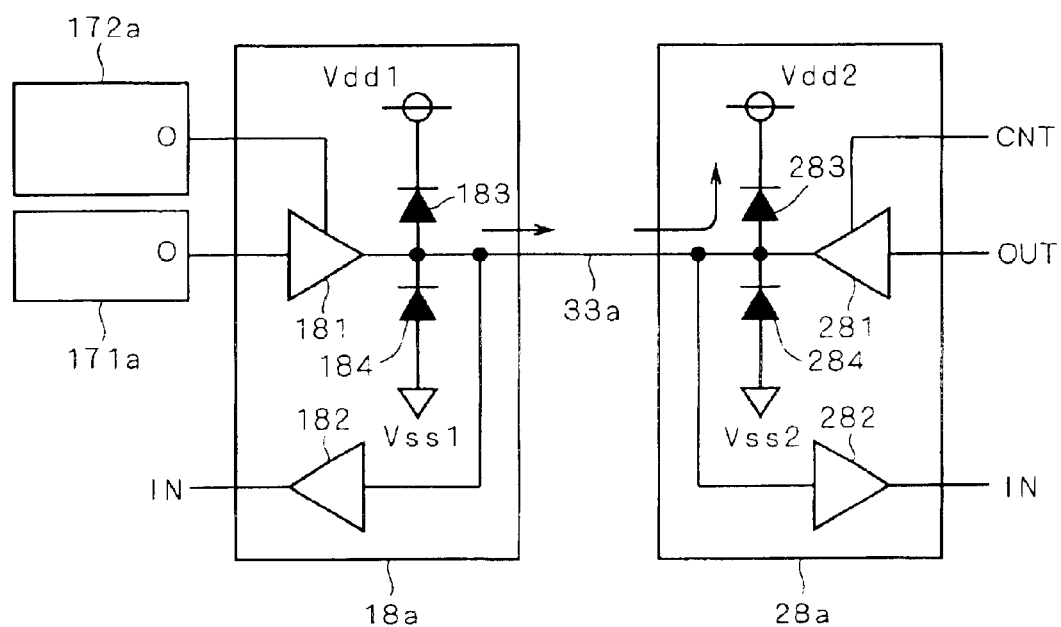
F I G . 5

F I G . 7
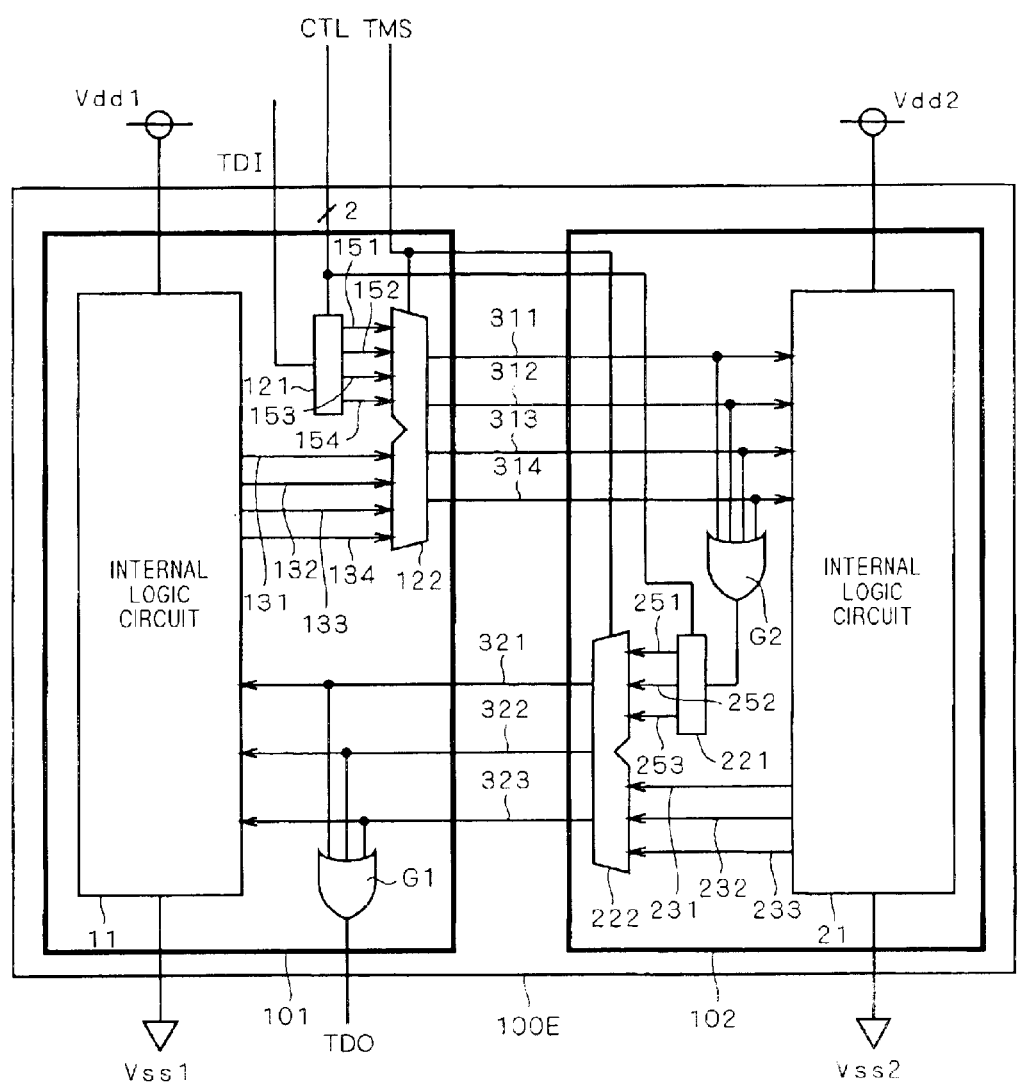

F I G . 8
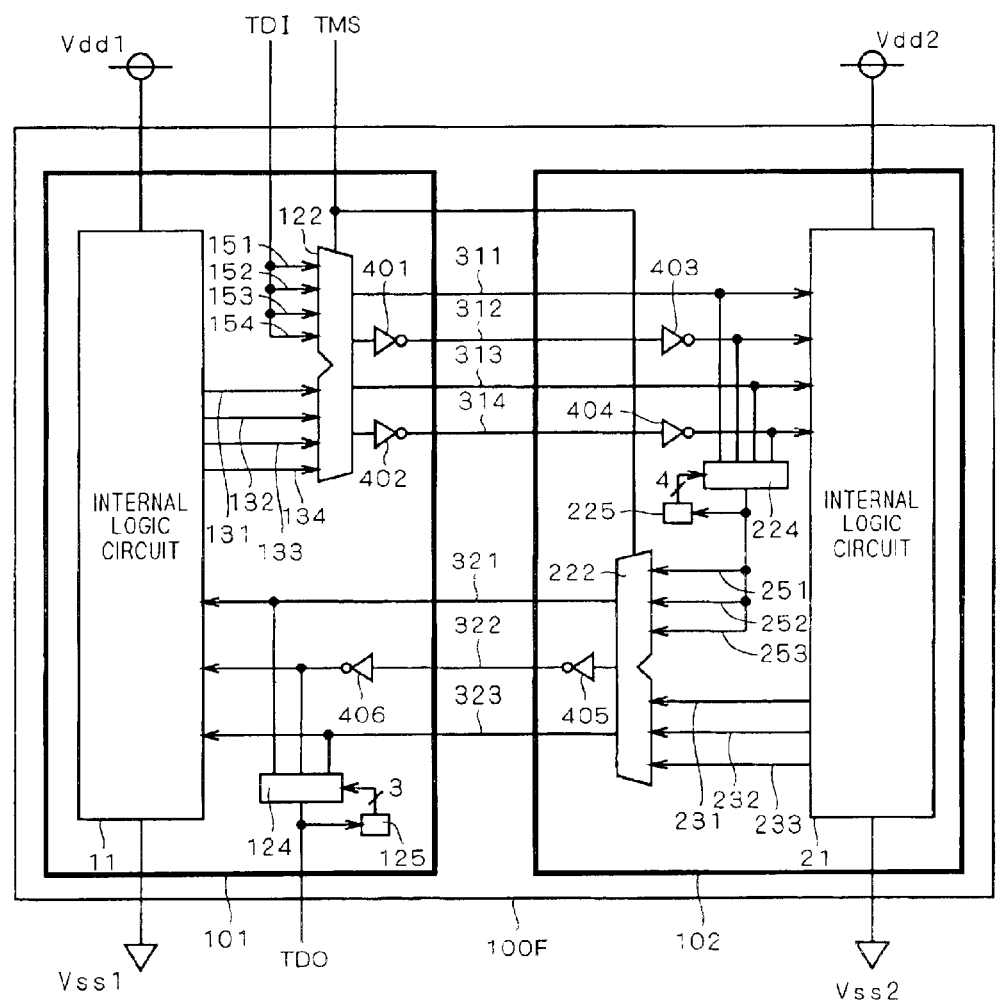

MULTICHIP MODULE

BACKGROUND OF THE INVENTION

1. Field of the Invention

The present invention relates to a technique for checking quality of a wiring. More particularly, the present invention relates to a technique for checking quality of wirings connecting a plurality of chips which are, for example, incorporated in a single package.

2. Description of the Background Art

There is a case that a plurality of semiconductor integrated circuit chips (hereinafter, simply referred to as "chips") are incorporated into a single package. This package is, for example, referred to as a multichip module. For example, the multichip module can realize a SIP (System In a Package).

The multichip module has the wiring connecting the chips in the package. If any defectiveness is present in the wiring, the multichip module is a defective product regardless of quality of each chip.

Defectiveness of the wiring is detectable through a function test applied to all of the package. However, making clear the mutual relationship between function defectiveness and wiring defectiveness is not always easy. Furthermore, in some cases, producing a signal pattern used for detecting the wiring defectiveness may be difficult.

In view of the above, there is a conventional technique proposed for detecting the wiring defectiveness according to which an arbitrary signal is input from an input terminal group to the wiring and this signal is output via the wiring to an output terminal group. This kind of conventional technique is, for example, disclosed in the Japanese Patent Application Laid-open No. 2000-022072.

However, according to the technique disclosed in the above prior art document, transmission of the signal from the input terminal group to the output terminal group is parallel. Accordingly, numerous terminals are necessary to perform the quality test.

SUMMARY OF THE INVENTION

It is an object of the present invention to provide a technique for checking quality of a wiring according to which a serial test signal is used to decrease the number of terminals necessary for performing the wiring quality check.

The present invention provides a first multichip module including a first chip, a second chip, and a first wiring and a second wiring each connecting the first chip and the second chip.

The first chip includes an internal circuit and a selector. The internal circuit has an output terminal and an input terminal. The selector has a first input terminal, a second input terminal connected to the output terminal of the internal circuit of the first chip, and an output terminal selectively outputting a signal given to the first input terminal or a signal given to the second input terminal.

The second chip includes an internal circuit and a selector. The internal circuit has an output terminal and an input terminal. The selector has a first input terminal connected to the input terminal of the internal circuit of the second chip, a second input terminal connected to the output terminal of the internal circuit of the second chip, and an output terminal.

The output terminal of the selector of the first chip is connected via the first wiring to the input terminal of the internal circuit of the second chip. The output terminal of the selector of the second chip is connected via the second wiring to the input terminal of the internal circuit of the first chip.

The selector of the second chip outputs the signal given to the first input terminal thereof to the output terminal thereof when the selector of the first chip outputs the signal given to the first input terminal thereof to the output terminal thereof. The selector of the second chip outputs the signal given to the second input terminal thereof to the output terminal thereof when the selector of the first chip outputs the signal given to the second input terminal thereof to the output terminal thereof.

Each of the selectors of the first and second chips outputs the signal given to their second input terminals to their output terminals, to transmit and receive the signals between the first chip and the second chip. On the other hand, each of the selectors of the first and second chips can output the signal given to their first input terminals to their output terminals. In the latter case, a test signal is given to the first input terminal of the selector of the first chip to measure a detection signal from the second wiring in the first chip, thereby enabling detection of breakage failure occurring in the first wirings as well as in the second wirings. In this case, a serial signal can be used for performing the test and accordingly external connections necessary for the test signal is only two.

The present invention provides a second multichip module including a first chip, a second chip, and a plurality of wirings each connecting the first chip and the second chip.

The first chip includes an internal circuit and an input buffer and an output buffer. The internal circuit outputs an output signal group consisting of a plurality of output signals. The input buffer and the output buffer are provided for each of the plurality of wirings.

The second chip includes an input buffer and an output buffer provided for each of the plurality of wirings.

Each of respective output buffers of the first chip, having an output terminal and an input terminal, operates under a power voltage obtained as a potential difference between a first power source and a second power source. The output terminal is connected to one end of a corresponding one of the plurality of wirings. Either a corresponding one of the plurality of output signals or a test signal is given to the input terminal. Each of respective input buffers of the first chip has an input terminal connected to the one end of the corresponding one of the plurality of wirings.

Each of respective output buffers of the second chip, having an output terminal and an input terminal, operates under a power voltage obtained as a potential difference between a third power source and a fourth power source. The output terminal is connected to the other end of the corresponding one of the plurality of wirings and brought into a condition insulated from the output buffer of the second chip when the output buffer of the second chip is inactive. Each of respective input buffers of the second chip has an input terminal connected to the other end of the corresponding one of the plurality of wirings.

And, the logic of only one test signal is different from logics of other test signals.

The output signal group is outputted from the output terminals of a plurality of output buffers of the first chip, and is transmitted via a plurality of wirings to a plurality of input buffers of the second chip. On the contrary, the signal can be transmitted from the output terminals of a plurality of output buffers of the second chip via a plurality of wirings to a plurality of input buffers of the first chip. Furthermore, a plurality of test signals can be outputted in parallel from the output terminals of the plurality of output buffers of the first chip. In this case, unless the wiring transmitting one test signal is broken, an electric potential of the third power source or the fourth power source fluctuates via a parasitic diode residing between this wiring and the third power source in response to bringing the output buffer of the second chip into an inactive condition. In an event that a short circuit is caused between the wiring transmitting one test signal and a wiring transmitting another test signal, increased current will flow between the first power source and the second power source. Therefore, it is possible to detect breakage failure or short-circuit failure in the plurality of wirings. In this case, the logic of only one test signal is different from logics of other test signals. Hence, it becomes possible to reduce the number of external connections even in a case the test signals are entered from the outside.

The present invention provides a third multichip module including a first chip, a second chip, a plurality of first wirings, and a plurality of second wirings.

Signals are transmitted from the first chip via the plurality of first wirings to the second chip. Signals are transmitted from the second chip via the plurality of second wirings to the first chip.

The first chip has an internal circuit, a first wiring group, a second wiring group, a demultiplexer, a selector, and a logic gate. An output of the internal circuit of the first chip is given to the first wiring group. The demultiplexer inputs a test signal and gives the test signal to any one wiring of the second wiring group of the first chip based on a control signal. The selector outputs a signal given to the first wiring group of the first chip or a signal given to the second wiring group of the first chip to the plurality of first wirings. The logic gate executes a logical operation for the signals given to the plurality of second wirings.

The second chip has an internal circuit, a first wiring group, a second wiring group, a demultiplexer, a selector, and a logic gate. The logic gate executes a logical operation for the signals given to the plurality of first wirings. An output of the internal circuit of the second chip is given to the first wiring group. The demultiplexer inputs an output of the logic gate of the second chip and gives the output of the logic gate of the second chip to any one wiring of the second wiring group of the second chip based on the control signal. The selector outputs a signal given to the first wiring group of the second chip or a signal given to the second wiring group of the second chip to the plurality of second wirings.

The selector of the second chip outputs the signal given to the first wiring group of the second chip to the plurality of second wirings when the selector of the first chip outputs the signal given to the first wiring group of the first chip to the plurality of first wirings. The selector of the second chip outputs the signal given to the second wiring group of the second chip to the plurality of second wirings when the selector of the first chip outputs the signal given to the second wiring group of the first chip to the plurality of first wirings. And, each of the logic gate of the first chip and the logic gate of the second chip checks whether or not their inputs agree with each other.

The selector of the first chip outputs the signal given to the first wiring group of the first chip to the plurality of first wirings. The selector of the second chip outputs the signal given to the first wiring group of the second chip to the plurality of second wirings. Accordingly, transmitting and receiving the signals between the first chip and the second chip is feasible. On the other hand, the selector of the first chip outputs the signal given to the second wiring group of the first chip to the plurality of first wirings. The selector of the second chip outputs the signal given to the second wiring group of the second chip to the plurality of second wirings. Accordingly, by comparing the output of the logic gate of the first chip with the test signal, it becomes possible to detect breakage failure occurring in the first wirings as well as in the second wirings. In this case, a serial signal can be used for performing the test and accordingly external connections necessary for the test signal is only two.

The present invention provides a fourth multichip module including a first chip, a second chip, a plurality of first wirings and a plurality of second wirings.

Signals are transmitted from the first chip via the plurality of first wirings to the second chip. Signals are transmitted from the second chip via the plurality of second wirings to the first chip.

The first chip has an internal circuit, a first wiring group, a second wiring group, a first selector, and a second selector. An output of the internal circuit of the first chip is given to the first wiring group. The second wiring group consists of a plurality of wirings to which a test signal is given.

The first selector outputs a signal given to the first wiring group of the first chip or a signal given to the second wiring group of the first chip to the plurality of first wirings. The second selector outputs any one of signals given to the plurality of second wirings.

The second chip has an internal circuit, a first wiring group, a second wiring group, a first selector, and a second selector. The first selector outputs any one of signals given to the plurality of first wirings. An output of the internal circuit of the second chip is given to the first wiring group. The second wiring group consists of a plurality of wirings to which the output of the selector of the second chip is given. The second selector outputs a signal given to the first wiring group of the second chip or a signal given to the second wiring group of the second chip to the plurality of second wirings.

The second selector of the second chip outputs the signal given to the first wiring group of the second chip to the plurality of second wirings when the first selector of the first chip outputs the signal given to the first wiring group of the first chip to the plurality of first wirings. The second selector of the second chip outputs the signal given to the second wiring group of the second chip to the plurality of second wirings when the first selector of the first chip outputs the signal given to the second wiring group of the first chip to the plurality of first wirings.

Accordingly, by letting the logic of the test signal make transition repetitively and comparing it with transition of the logic of the output of the second selector of the first chip, it becomes possible to detect breakage failure occurring in the first wirings as well as in the second wirings.

These and other objects, features, aspects and advantages of the present invention will become more apparent from the following detailed description of the present invention when taken in conjunction with the accompanying drawings.

BRIEF DESCRIPTION OF THE DRAWINGS

FIGS. 4 and 5 are circuit diagrams showing detailed arrangements of the third embodiment of the present invention.

FIG. 7 is a circuit diagram showing an example of test technique in accordance with a fifth embodiment of the present invention.

FIG. 8 is a circuit diagram showing an example of test technique in accordance with a sixth embodiment of the present invention.

DESCRIPTION OF THE PREFERRED EMBODIMENTS

First Embodiment

Figure 1:
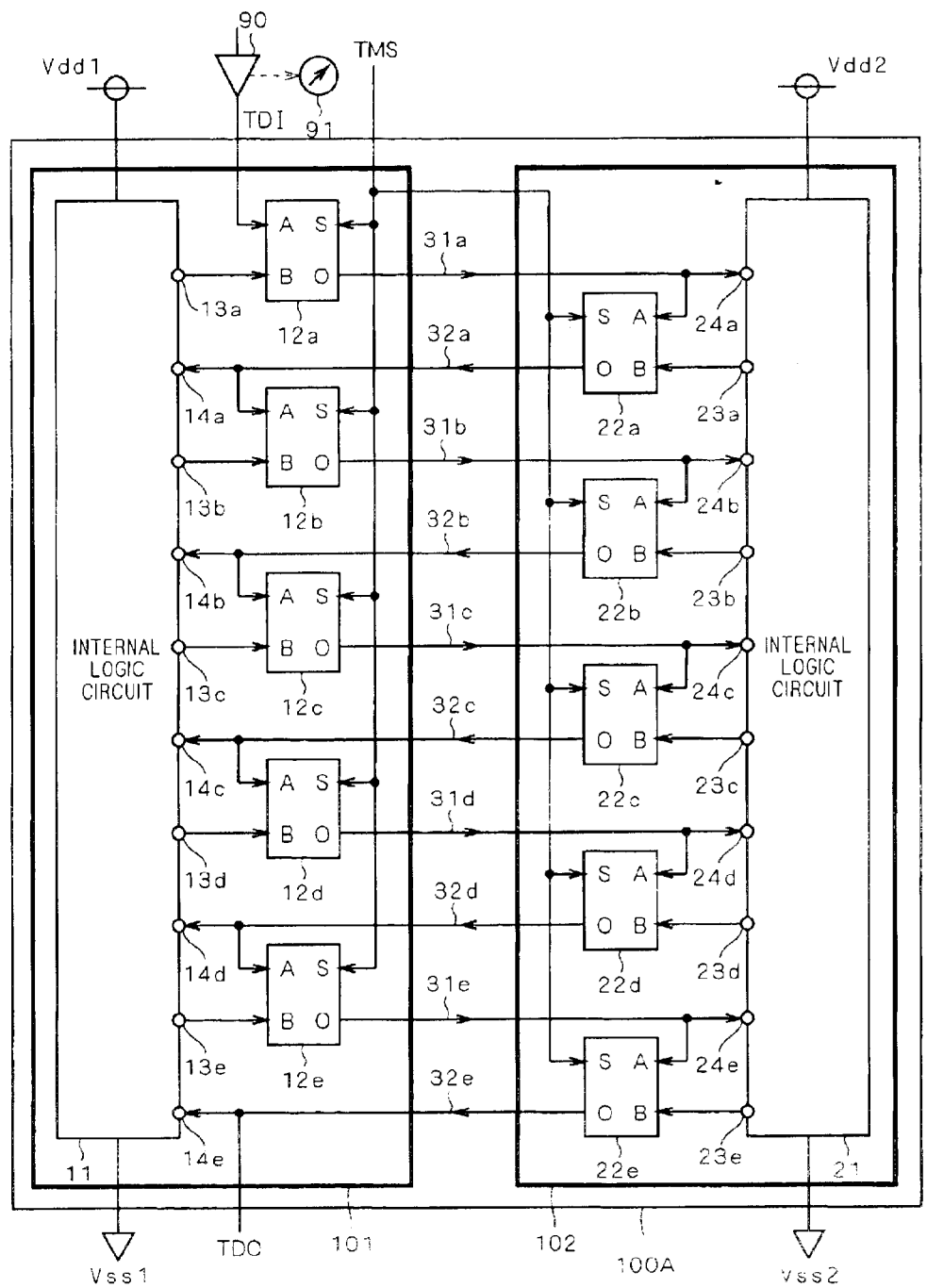
FIG. 1 is a circuit diagram showing an example of test technique in accordance with a first embodiment of the present invention.

FIG. 1 is a circuit diagram showing an example of test technique in accordance with a first embodiment of the present invention. Two chips 101 and 102 are provided in a module 100A. For example, the module 100A is realized as a single package.

The module 100A has wirings 31a to 31e and 32a to 32e provided between two chips 101 and 102 for connecting these chips 101 and 102. More specifically, signals directed from the chip 101 to the chip 102 are transmitted via the wirings 31a to 31e, while signals directed from the chip 102 to the chip 101 are transmitted via the wirings 32a to 32e.

The chip 101 includes an internal logic circuit 11 and selectors 12a to 12e. The chip 102 includes an internal logic circuit 21 and selectors 22a to 22e.

The internal logic circuit 11 has signal output terminals 13a to 13e and signal input terminals 14a to 14e. The internal logic circuit 21 has signal output terminals 23a to 23e and signal input terminals 24a to 24e.

The internal logic circuit 11 is connected to a power source Vdd1 giving a high electric potential and to a power source Vss1 giving a low electric potential (e.g., a ground potential). The internal logic circuit 11 operates under a power voltage obtained as a potential difference between these power sources Vdd1 and Vss1. On the other hand, the internal logic circuit 21 is connected to a power source Vdd2 giving a high electric potential and to a power source Vss2 giving a low electric potential (e.g., a ground potential). The internal logic circuit 21 operates under a power voltage obtained as a potential difference between these power sources Vdd2 and Vss2.

Each of the selectors 12a to 12e and 22a to 22e has a first input terminal A, a second input terminal B, an output terminal O, and a select terminal S.

Each of the selectors 12a to 12e and 22a to 22e selects a signal given to its input terminal A or a signal given to its second input terminal B in accordance with activeness/inactiveness of a signal given to its select terminal S and outputs the selected signal from its output terminal O. A test mode select signal TMS is commonly given to the select terminals S of respective selectors 12a to 12e and 22a to 22e.

Transmitting and receiving signals between the chips 101 and 102 is executed via the wirings 31a to 31e and 32a to 32e. In this signal transmitting and receiving operation, when the test mode select signal TMS is inactive, mutual input and output is feasible between the internal logic circuits 11 and 12. When the test mode select signal TMS is active, the test signal TDI is transmitted and received between the internal logic circuits 11 and 12 irrespective of input and output of the internal logic circuits 11 and 12.

Between the internal logic circuits 11 and 21, the selectors 12a to 12e and 22a to 22e are serially connected to corresponding wirings 31a to 31e and 32a to 32e via their second input terminals B and their output terminals O. More specifically, the second input terminal B of the selector 12a is connected to the signal output terminal 13a and its output terminal O is connected via the wiring 31a to the input terminal 24a. The second input terminal B of the selector 22a is connected to the signal output terminal 23a and its output terminal O is connected via the wiring 32a to the signal input terminal 14a. The second input terminal B of the selector 12b is connected to the signal output terminal 13b and its output terminal O is connected via the wiring 31b to the input terminal 24b. The second input terminal B of the selector 22b is connected to the signal output terminal 23b and its output terminal O is connected via the wiring 32b to the signal input terminal 14b. The second input terminal B of the selector 12c is connected to the signal output terminal 13c and its output terminal O is connected via the wiring 31c to the input terminal 24c. The second input terminal B of the selector 22c is connected to the signal output terminal 23c and its output terminal O is connected via the wiring 32c to the signal input terminal 14c. The second input terminal B of the selector 12d is connected to the signal output terminal 13d and its output terminal O is connected via the wiring 31d to the input terminal 24d. The second input terminal B of the selector 22d is connected to the signal output terminal 23d and its output terminal O is connected via the wiring 32d to the signal input terminal 14d. The second input terminal B of the selector 12e is connected to the signal output terminal 13e and its output terminal O is connected via the wiring 31e to the input terminal 24e. The second input terminal B of the selector 22e is connected to the signal output terminal 23e and its output terminal O is connected via the wiring 32e to the signal input terminal 14e.

The selectors 12a to 12e and 22a to 22e are serially connected with each other via their first input terminals A and output terminals O. More specifically, the output terminal O of the selector 12a is connected via the wiring 31a to the first input terminal A of the selector 22a. The output terminal O of the selector 22a is connected via the wiring 32a to the first input terminal A of the selector 12b. The output terminal O of the selector 12b is connected via the wiring 31b to the first input terminal A of the selector 22b. The output terminal O of the selector 22b is connected via the wiring 32b to the first input terminal A of the selector 12c. The output terminal O of the selector 12c is connected via the wiring 31c to the first input terminal A of the selector 22c. The output terminal O of the selector 22c is connected via the wiring 32c to the first input terminal A of the selector 12d. The output terminal O of the selector 12d is connected via the wiring 31d to the first input terminal A of the selector 22d. The output terminal O of the selector 22d is connected via the wiring 32d to the first input terminal A of the selector 12e. The output terminal O of the selector 12e is connected via the wiring 31e to the first input terminal A of the selector 22e.

The test signal TDI is outputted from a driver 90 and is given to the first input terminal A of the selector 12a. The driver 90 can be provided outside the chip 101 or inside the chip 101.

The module 100A, under the condition that the wirings 31a to 31e and 32a to 32e are normal, successively transmits the test signal TDI to the wirings 31a, 32a, 31b, - - - , 32d, 31e and 32e in this order when the test mode select signal TMS is activated. Accordingly, it becomes possible to detect breakage failure occurring in respective wirings 31a to 31e and 32a to 32e by giving the serial test signal TDI to the chip 101 and measuring a detection signal TDO from the wiring 32e in the chip 101.

Accordingly, when the module 100A is connected to an external device via the first input terminal A of the selector 12a and the output terminal O of the selector 22e, it becomes possible to check the quality of a plurality of wirings by using only two portions to be connected to the external device for the wiring quality test.

Furthermore, when the test mode select signal TMS is inactive, the signal output terminals 13a to 13e and 23a to 23e can transmit signals via the wirings 31a to 31e and 32a to 32 to the signal input terminals 24a to 24e and 14a to 14e.

Second Embodiment

Figure 2:
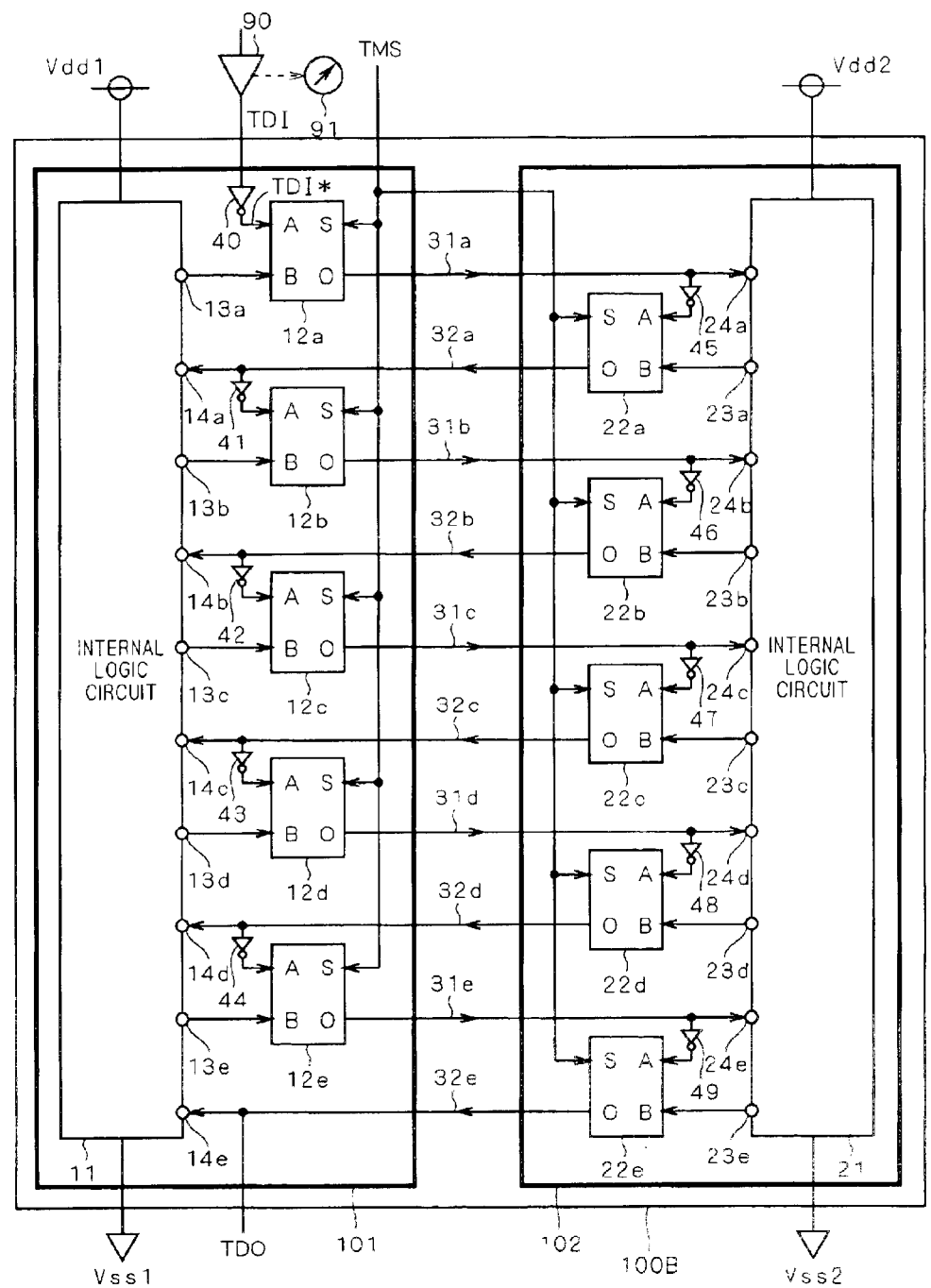
FIG. 2 is a circuit diagram showing an example of test technique in accordance with a second embodiment of the present invention.

FIG. 2 is a circuit diagram showing an example of test technique in accordance with a second embodiment of the present invention. A module 100B is different from the module 100A shown in the first embodiment in that inverters 40 to 49 are additionally provided immediately in front of the first input terminals A of respective selectors 12a to 12e and 22a to 22e.

The module 100B, under the condition that the wirings 31a to 31e and 32a to 32e are normal, transmits an inverted signal TDI* of the test signal to the wirings 31a to 31e and transmits the test signal TDI to the wirings 32a to 32e when the test mode select signal TMS is activated.

According to this embodiment, like the above-described embodiment shown in FIG. 1, it is possible to detect breakage failure occurring in the wirings 31a to 31e and 32a to 32e by measuring the detection signal TDO.

Furthermore, it is possible to detect short-circuit failure occurring between the wirings 31a to 31e and the wirings 32a to 32e by detecting current consumed in the driver 90. When short circuit occurs between these wirings 31a to 31e and 32a to 32e, the current consumed in the driver 30 increases due to collision between the test signal TDI and the inverted signal TDI*.

A current measuring section 91 is an example of technique for measuring the current consumed in the driver 90. When the driver 90 is incorporated in the chip 101, it may be preferable to detect variation of the consumed current flowing between the power sources Vdd1 and Vss1.

Third Embodiment

Figure 3:
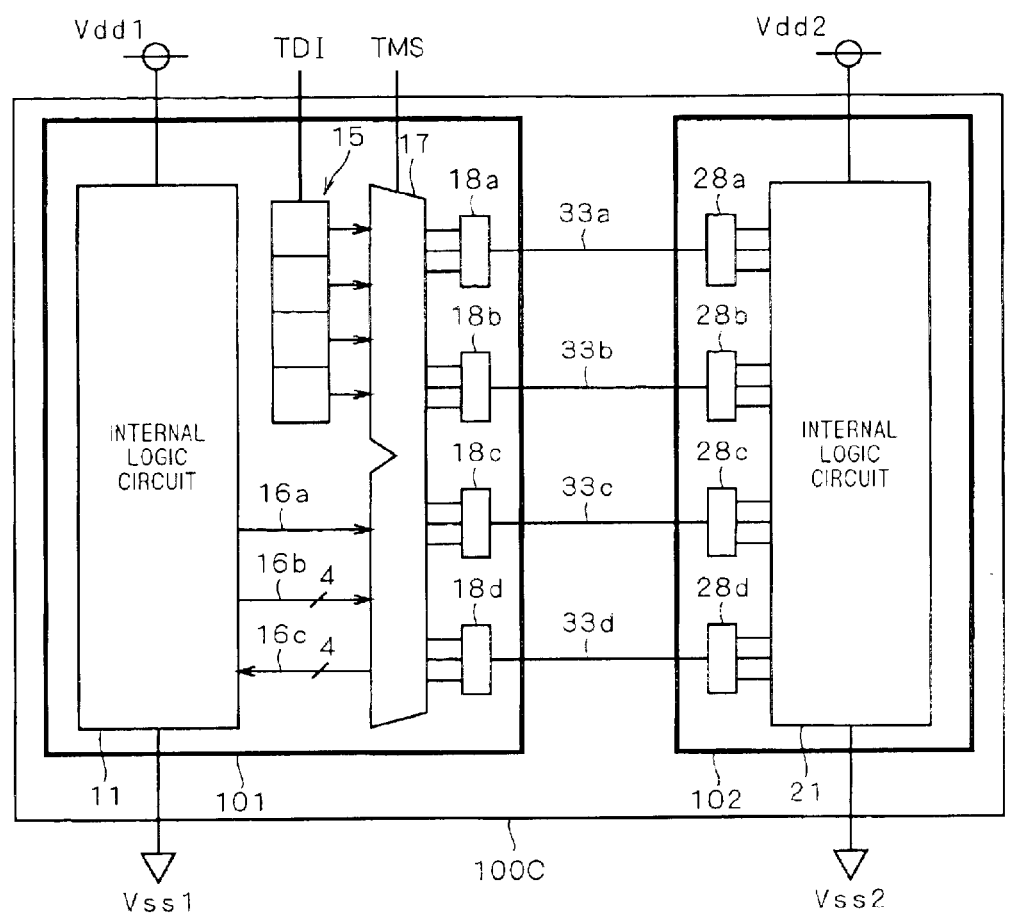
FIG. 3 is a circuit diagram showing an example of test technique in accordance with a third embodiment of the present invention.

FIG. 3 is a circuit diagram showing an example of test technique in accordance with a third embodiment of the present invention. Two chips 101 and 102 are provided in a module 100C. For example, the module 100C is realized as a single package.

The module 100C has wirings 33a to 33d provided between two chips 101 and 102 for connecting these chips 101 and 102. Mutual transmitting and receiving signals between the chip 101 and the chip 102 is performed via the wirings 33a to 33d.

The chip 101 includes an internal logic circuit 11, a shift register group 15, a selector 17, and input/output buffers 18a to 18d. The chip 102 includes an internal logic circuit 21 and input/output buffers 28a to 28d. The number of input/output buffers 18a to 18d is identical with the number of input/output buffers 28a to 28d.

The internal logic circuit 11 is connected to a power source Vdd1 giving a high electric potential and to a power source Vss1 giving a low electric potential (e.g., a ground potential). The internal logic circuit 11 operates under a power voltage obtained as a potential difference between these power sources Vdd1 and Vss1. On the other hand, the internal logic circuit 21 is connected to a power source Vdd2 giving a high electric potential and to a power source Vss2 giving a low electric potential (e.g., a ground potential). The internal logic circuit 21 operates under a power voltage obtained as a potential difference between these power sources Vdd2 and Vss2.

Figure 4:
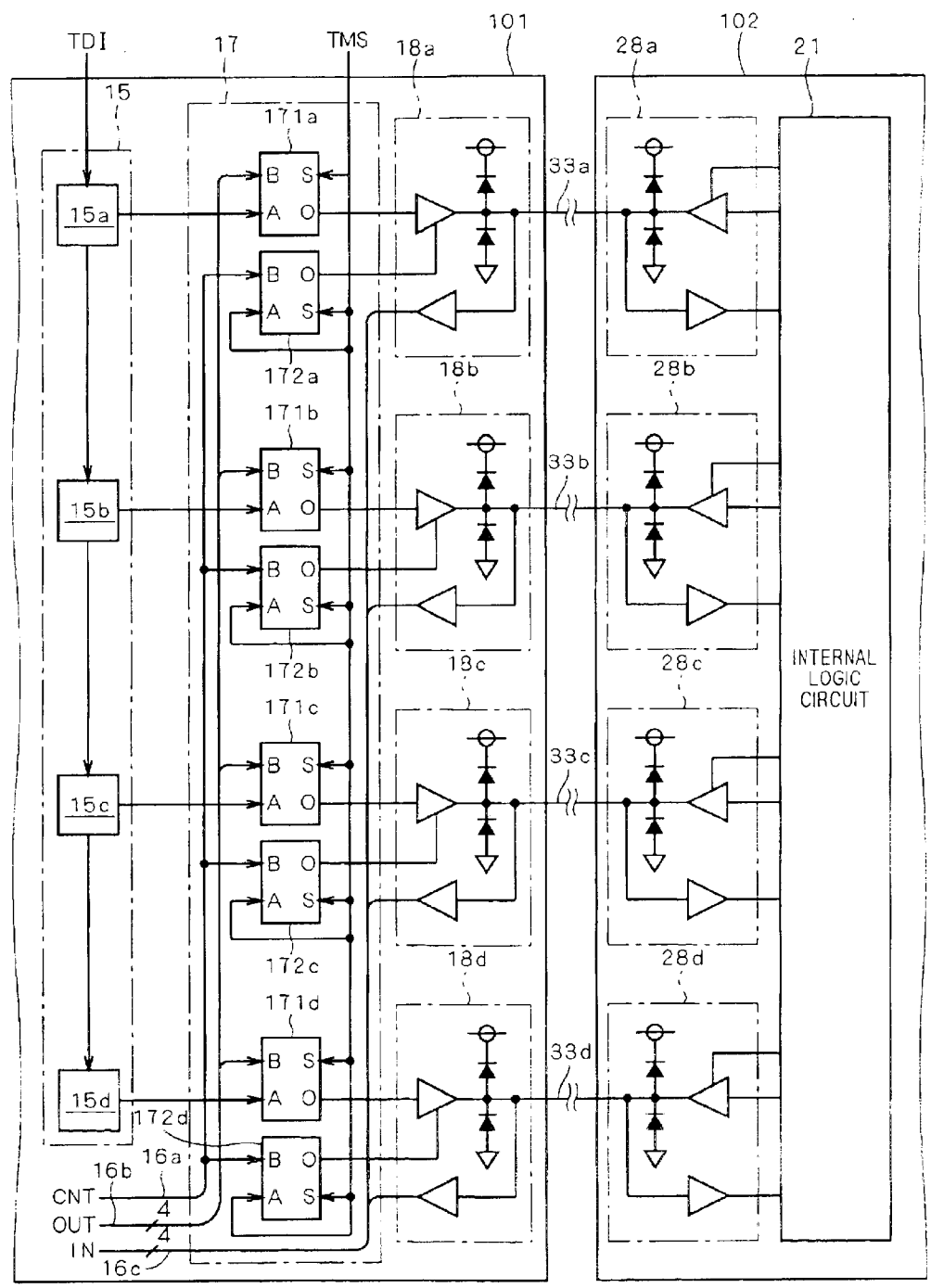

FIG. 4 is a circuit diagram showing a detailed arrangement of the shift register group 15, the selector 17, and input/output buffers 18a to 18d and 28a to 28d.

The shift register group 15 has shift registers 15a to 15d whose number (four, in this embodiment) is identical with the number of the input/output buffers 18a to 18d. The shift registers 15a to 15d are serially connected. The shift register 15a inputs the test signal TDI from the outside of the module 100C. The test signal TDI is successively transmitted to the shift registers 15b, 15c, and 15d.

For example, a logic "H" serving as the test signal TDI is once given to the shift register 15a, and then a logic "L" is given. In response to this test signal, only one of the logics outputted from the shift registers 15a to 15d becomes "H" and the remainder becomes "L." More specifically, a set of outputs outputted from the shift registers 15a, 15b, 15c, and 15d changes successively into "HLLL", "LHLL", "LLHL", and "LLLH."

The selector 17 inputs a parallel signal obtained from the shift registers 15a to 15d as one input and also inputs a parallel output signal group 16b from the internal logic circuit 11 as the other input. The selector 17 switches the one input and the other input and outputs them. A plurality of output signals constituting the parallel output signal group 16b is identical in number with the shift registers 15a to 15d.

The input/output buffers 18a to 18d receive the parallel output from the selector 17 and transmit it to the corresponding wirings 33a to 33d.

On the contrary, when a parallel signal is transmitted from the input/output buffers 28a to 28d via the wirings 33a to 33d to the input/output buffers 18a to 18d, it is possible to output this signal as a parallel input signal group 16c to the internal logic circuit 11. Input/output control for the input/output buffers 18a to 18d can be performed by using a control signal 16a (CNT) obtained from the internal logic circuit 11.

The selector 17 includes selectors 171a to 171d and 172a to 172d whose number is twice the number of shift registers 15a to 15d, i.e., twice the number of input/output buffers 18a to 18d. Each of the selectors 171a to 171d and 172a to 172d includes a first input terminal A, a second input terminal B, an output terminal O, and a select terminal S.

The outputs of shift registers 15a to 15d are given to the first input terminals A of selectors 171a to 171d, respectively. The signals contained in the parallel output signal group 16b are given to their second input terminals B, respectively.

The test mode select signal TMS is commonly given to the first input terminals A of selectors 172a to 172d. The control signal 16a is commonly given to their second input terminals B. The test mode select signal TMS is given to each select terminal S of the selectors 171a to 171d and 172a to 172d.

Each of the selectors 171a to 171d and 172a to 172d selects a signal given to its first input terminal A or a signal given to its second input terminal B in accordance with activeness/inactiveness of a signal given to its select terminal S and outputs a selected signal from its output terminal O.

Accordingly, when the test mode select signal TMS is active, the outputs of shift registers 15a to 15d are outputted from the output terminals O of selectors 171a to irrespective of the parallel output signal group 16b. The activated test mode select signal TMS is outputted from the output terminals O of selectors 172a to 172d irrespective of the control signal 16a.

Furthermore, when the test mode select signal TMS is inactive, the parallel output signal group 16b is output from the output terminals O of selectors 171a to 171d irrespective of the outputs of shift registers 15a to 15d. The control signal 16a is outputted from the output terminals O of selectors 172a to 172d.

FIG. 5 is a circuit diagram showing a practical arrangement of the input/output buffers 18a and 28a. The input/output buffer 18a has an output buffer 181 and an input buffer 182. The input/output buffer 28a has an output buffer 281 and an input buffer 282. The output buffer 181 is connected to power sources Vdd1 and Vss1 and operates under a power voltage obtained as a potential difference between these power sources Vdd1 and Vss1. The output buffer 281 is connected to power sources Vdd2 and Vss2 and operates under a power voltage obtained as a potential difference between these power sources Vdd2 and Vss2.

The wiring 33a has one end connected to the output terminal of output buffer 181 and also connected to the input terminal of input buffer 182 which are both located in the input/output buffer 18a. The other end of wiring 33a is connected to the output terminal of output buffer 281 and also connected to the input terminal of input buffer 282 which are both located in the input/output buffer 28a.

Although not shown in the drawing, the input/output buffers 18b to 18d are identical in arrangement with the input/output buffer 18a and the input/output buffers 28b to 28d are identical in arrangement with the input/output buffer 28a. Each of the wirings 33b to 33d has one end connected to the output terminal of its output buffer and the input terminal of its input buffer which are both located in each of the input/output buffers 18b to 18d and the other end connected to the output terminal of its output buffer and the input terminal of its input buffer which are both located in each of the input/output buffers 28b to 28d.

Parasitic diodes 183 and 184 are present in the output buffer 181. The parasitic diode 183 has an anode connected to the output terminal of output buffer 181 and a cathode connected to the power source Vdd1. The parasitic diode 184 has a cathode connected to the output terminal of output buffer 181 and an anode connected to the power source Vss1.

Similarly, parasitic diodes 283 and 284 are present in the output buffer 281. The parasitic diode 283 has an anode connected to the output terminal of output buffer 281 and a cathode connected to the power source Vdd2. The parasitic diode 284 has a cathode connected to the output terminal of output buffer 281 and an anode connected to the power source Vss2.

An output obtained from the output terminal O of shift register 172a is employed as a signal determining whether or not the output buffer 181 operates normally. An output obtained from the output terminal O of selector 171a is employed as an input to the output buffer 181.

When the test mode select signal TMS is active, the output of shift register 15a is outputted from the output terminal of output buffer 181. On the other hand, when the test mode select signal TMS is inactive and the control signal 16a is active, one of the parallel output signals constituting the parallel output signal group 16b and entering into the second input terminal B of selector 171a is outputted from the output terminal of output buffer 181. When both of the test mode select signal TMS and the control signal 16a are inactive, the output terminal of output buffer 181 is brought into an insulated condition (i.e., high-impedance condition) insulated from the output buffer 181.

Similarly, when the output buffer 281 is inactivated in response to a signal controlling activation/inactivation of output buffer 281 (i.e., a signal CNT given to the output buffer 281 in FIG. 5), the output terminal of output buffer 281 is brought into a high-impedance condition.

A test for checking quality of wirings is performed by activating the test mode select signal TMS, inactivating the output buffer 281, and setting the electric potential given by the power source Vdd2 to be sufficiently lower than the electric potential given by the power source Vdd1. For example, the latter is set to be higher than the former at least by a junction voltage of parasitic diode 283. For example, the electric potential given by the power source Vdd2 is equalized with the electric potential given by the power source Vss2.

Under the above-described settings, when the test signal TDI having a logic "H" is transmitted to the shift register 15a, the parasitic diode 283 becomes conductive and allows a current to flow in the direction shown by an arrow in FIG. 5 unless no breakage failure occurs in the wiring 33a because the output terminal of output buffer 281 has a very high impedance. Accordingly, measuring the electric potential of the power source Vdd2 makes it possible to detect the presence of breakage failure. When the electric potential of the power source Vdd2 shows rising, it is judged that no breakage failure is present. When the electric potential of the power source Vdd2 shows no rising, it is judged that a breakage failure is present.

Furthermore, the logic "L" is transmitted to the wirings 33b to 33d. Even when no breakage failure occurs in the wirings 33b to 33d, large current will flow in the output buffer 181 if a short-circuit failure is present in the wiring 33a. Accordingly, detecting whether or not the current flowing in the output buffer 181 shows rising makes it possible to detect the presence or the absence of short-circuit failure.

For example, when the current flowing in the output buffer 181 increases, the current flowing from the outside of the module 100C to the power sources Vdd1 and Vss1 increases. Hence, it is possible to detect the short-circuit failure by measuring the current of the power sources Vdd1 and Vss1.

Similarly, when the test signal TDI having a logic "H" is transmitted to the shift registers 15b, 15c, and 15d under the above-described test settings, it is possible to detect breakage failure or short-circuit failure of respective wirings 33b, 33c, and 33d.

Contrary to the above-described embodiment, it is possible to once give a logic "L" serving as the test signal TDI to the shift register 15a and later give "H." In response to this test signal, only one of the logics outputted from the shift registers 15a to 15d becomes "L" and the remainder becomes "H."

In this case, the electric potential given by the power source Vss2 is set to be sufficiently higher than the electric potential given by the power source Vss1. For example, its difference is set to be not smaller than the junction voltage of the parasitic diode 284. According to this setting, when the wiring 33a is normal, falling of the electric potential of power source Vss2 is measured. When breakage failure occurs in the wiring 33a, no such falling is measured. Furthermore, the short-circuit failure occurring between the wiring 33a and the wirings 33b to 33d is also detectable by measuring the consumed current of the chip 101.

Accordingly, when the module 100C is connectable from its outside via the input portion of shift register 15a and the input portion for the test signal TDI, it becomes possible to check the breakage failure and short-circuit failure of a plurality of wirings by using only two portions to be connected to the outside for the wiring quality test.

When the test mode select signal TMS is inactivated and the electric potentials of the power sources Vdd1, Vdd2, Vss1 and Vss2 are set to predetermined values, it is possible to transmit and receive signals between the chips 101 and 102 via the wirings 33a to 33d by using the input/output buffers 18a to 18d and 28a to 28d.

Fourth Embodiment

Figure 6:
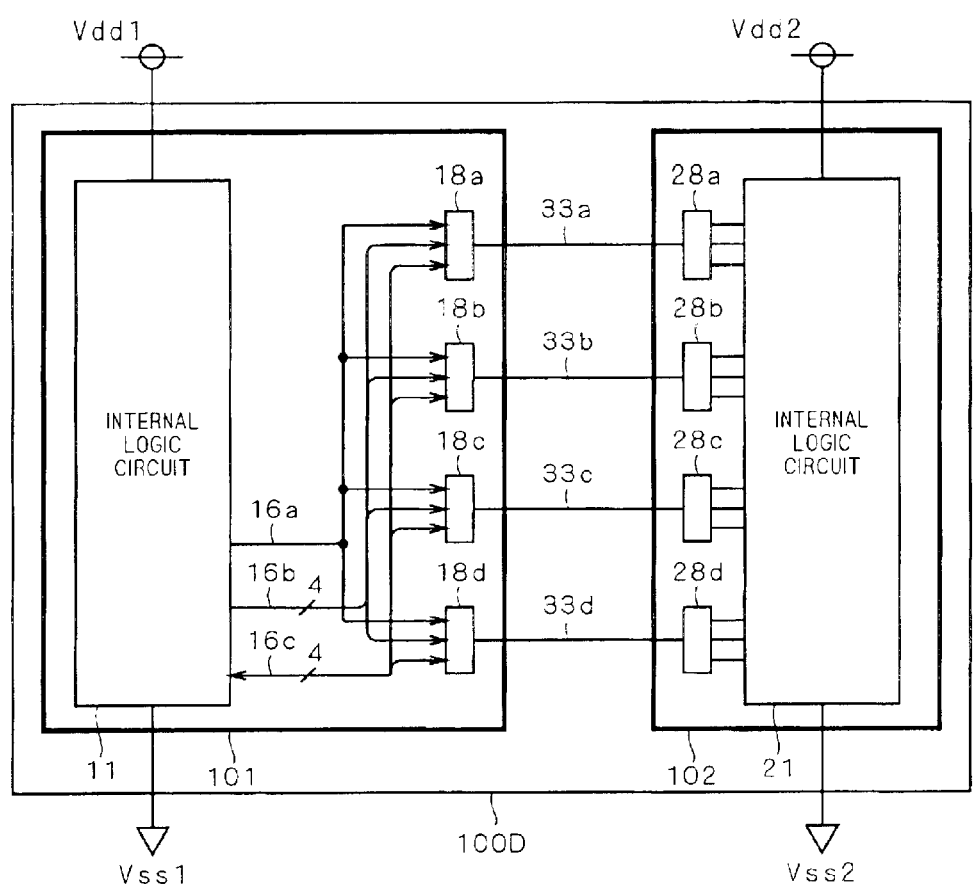
FIG. 6 is a circuit diagram showing an example of test technique in accordance with a fourth embodiment of the present invention.

FIG. 6 is a circuit diagram showing an example of test technique in accordance with a fourth embodiment of the present invention. A module 100D is different from the module 100C shown in the third embodiment in that the shift register group 15 and the selector 17 are omitted.

During the test of wirings 33a to 33d, the internal logic circuit 11 changes the parallel output signals constituting the parallel output signal group 16b for the test. More specifically, one of the parallel output signals is brought into logic "H" and the remainder is brought into logic "L." The parallel output signals are successively replaced as a signal having logic "H." Alternatively, one of the parallel output signals is brought into logic "L" and the remainder is brought into logic "H." The parallel output signals are successively replaced as a signal having logic "L."

In the fourth embodiment, like the third embodiment, it is possible to detect breakage failure or short-circuit failure of the wirings 33a to 33d by measuring the presence of electric potential variation of or consumed current increase between the power sources Vdd1 and Vss1.

Furthermore, according to this embodiment, it is unnecessary to input the test mode select signal TMS or the test signal TDI from the outside. It is accordingly unnecessary to increase the portions connected to the outside for the test.

Fifth Embodiment

FIG. 7 is a circuit diagram showing an example of test technique in accordance with a fifth embodiment of the present invention. Two chips 101 and 102 are provided in a module 100E. For example, the module 100E is realized as a single package.

The module 100E has wirings 311 to 314 and 321 to 323 provided between two chips 101 and 102 for connecting these chips 101 and 102. More specifically, signals directed from the chip 101 to the chip 102 are transmitted via the wirings 311 to 314, while signals directed from the chip 102 to the chip 101 are transmitted via the wirings 321 to 323.

The chip 101 includes an internal logic circuit 11, a demultiplexer 121, a selector 122, wirings 151 to 154 and 131 to 134, and an OR gate G1. The chip 102 includes an internal logic circuit 21, a demultiplexer 221, a selector 222, and wirings 251 to 253 and 231 to 233.

The internal logic circuit 11 is connected to a power source Vdd1 giving a high electric potential and to a power source Vss1 giving a low electric potential (e.g., a ground potential). The internal logic circuit 11 operates under a power voltage obtained as a potential difference between these power sources Vdd1 and Vss1. On the other hand, the internal logic circuit 21 is connected to a power source Vdd2 giving a high electric potential and to a power source Vss2 giving a low electric potential (e.g., a ground potential). The internal logic circuit 21 operates under a power voltage obtained as a potential difference between these power sources Vdd2 and Vss2.

The internal logic circuit 11 outputs signals to the wirings 131 to 134 and inputs signals from the wirings 321 to 323. The internal logic circuit 21 outputs signals to the wirings 231 to 233 and inputs signals from the wirings 311 to 314. The number of the wirings 311 to 314 needs not be identical with the number of the wirings 321 to 323.

The demultiplexer 121 transmits a test signal TDI to one of the wirings 151 to 154. Choice among the wirings 151 to 154 is determined based on a control signal CTL given to the demultiplexer 121. Signals given to the wirings 151 to 154 are entered as one input group to the selector 122. Signals given to the wirings 131 to 134 are entered as the other input group to the selector 122. The selector 122 selects either the one input group or the other input group and outputs the selected input group to the wirings 311 to 314.

The demultiplexer 221 transmits an output of gate G2 to one of the wirings 251 to 253. Choice among the wirings 251 to 253 is determined based on the control signal CTL given to the demultiplexer 221. Signals given to the wirings 251 to 253 are entered as one input group to the selector 222. Signals given to the wirings 231 to 233 are entered as the other input group to the selector 222. The selector 222 selects either the one input group or the other input group and outputs the selected input group to the wirings 321 to 323.

Choice between a pair of input groups entered into each of the selectors 122 and 222 is determined based on a test mode select signal TMS. When the test mode select signal TMS is inactive, each of the selectors 122 and 222 outputs the above-described other input group. Accordingly, the signals outputted from the internal logic circuit 11 to the wirings 131 to 134 are entered into the internal logic circuit 21 via the wirings 311 to 314. The signals outputted from the internal logic circuit 21 to the wirings 231 to 233 are entered into the internal logic circuit 11 via the wirings 321 to 323. As described above, when the test mode select signal TMS is inactive, the chips 101 and 102 execute transmitting and receiving the signals.

Furthermore, when the test mode select signal TMS is active, each of the selectors 122 and 222 outputs the above-described one input group. Accordingly, the signals outputted from the demultiplexer 121 to the wirings 151 to 154 are entered into the internal logic circuit 21 via the wirings 311 to 314. The signals outputted from the demultiplexer 221 to the wirings 251 to 253 are entered into the internal logic circuit 11 via the wirings 321 to 323. As apparent from the foregoing description, when the test mode select signal TMS is active, the chips 101 and 102 execute transmitting and receiving the signals based on the test signal TDI irrespective of the input/output of internal logic circuits 11 and 12.

The OR gate G1 produces a logical sum of the signals given to the wirings 321 to 323 to output a detection signal TDO. The OR gate G2 outputs a logical sum of the signals given to the wirings 311 to 314 which is entered into the demultiplexer 221.

When the test mode select signal TMS is active, the test signal TDI is set to be logic "H." The demultiplexer 121 transmits the test signal TDI to only one wiring, e.g., wiring 151, depending on the value of control signal CTL. In this case, logic "H" is given to the wiring 151 and logic "L" is given to each of the wirings 152 to 154.

In a case that no breakage failure occurs in the wiring 311, the signal outputted from the OR gate G2 becomes logic "H" and the test signal TDI is transmitted to the demultiplexer 221. However, in a case that breakage failure is present in the wiring 311, the signal outputted from the OR gate G2 becomes logic "L."

In response to change of control signal CTL, the wiring through which the demultiplexer 121 transmits the test signal TDI is changed among the wirings 151 to 154. Accordingly, if any breakage failure is present in one of the wirings 311 to 314, the test signal TDI will not be transmitted to the demultiplexer 221 in case of selecting a certain control signal CTL.

The demultiplexer 221 transmits the output of OR gate G2 to only one wiring, e.g., wiring 251, depending on the value of control signal CTL. In this case, under the condition the output of OR gate G2 is logic "H", logic "H" is given to the wiring 251 and logic "L" is given to the wirings 252 and 253.

In a case that no breakage failure occurs in the wiring 321, the signal outputted from the OR gate G1 becomes logic "H." Namely, the signal outputted from the OR gate G1 is obtained as the detection signal TDO which has the same logic "H" as that of the test signal TDI.

However, when any breakage failure is present in the wiring 321, the signal outputted from the OR gate G1 becomes logic "L" even when the signal outputted from the OR gate G2 is logic "H."

In response to change of control signal CTL, the wiring through which the demultiplexer 221 transmits the signal TDI outputted from the OR gate G2 is changed among the wirings 251 to 253. Accordingly, in the condition that breakage failure is present in one of the wirings 321 to 323, even if the signal outputted from the OR gate G2 is logic "H", the detection signal TDO becomes logic "L" in case of selecting a certain control signal CTL. Thus, the logic of detection signal TDO disagrees with logic "H" of the test signal TDI.

As described above, in the case that breakage failure is present in at least one of the wirings 311 to 314 and 321 to 323, the detection signal TDO becomes logic "L" during successive changes of the control signal CTL under the condition that the test mode select signal TMS is activated and the test signal TDI is set to have logic "H." Accordingly, it becomes possible to detect breakage failure occurring in at least one of the above-described wirings. In a case that no breakage failure is present in the wirings, the detection signal TDO becomes logic "H" regardless of the control signal CTL.

It is needless to say that the test signal TDI can be set to be logic "L" for failure detection. In this case, logic "H" is given to the wirings 151 to 154 and 251 to 253 except for two wirings being selected among them based on the control signal CTL. Each of the OR gates G1 and G2 is replaced with AND gate. When breakage failure is present in at least one of the wirings 311 to 314 and 321 to 323, the detection signal TDO becomes logic "H." When no breakage failure is present in the wirings 311 to 314 and 321 to 323, the detection signal TDO becomes logic "L."

Namely, each of the logic gates G1 and G2 checks whether or not their inputs agree with each other. When their inputs agree with each other, it is possible to detect breakage failure occurred in wirings before reaching the each of the logic gates G1 and G2.

Like other embodiments, this embodiment requires only two portions to be connected to the outside for the test signal TDI used in the detection of breakage failure because a serial signal or a signal corresponding to a certain logic can be used as the test signal TDI.

According to this embodiment, it is possible to detect short-circuit failure occurring in the wirings 311 to 314. In an event that short circuit occurs between these wirings, an increased amount of current is consumed in the selector 122. This is detectable as electric potential variation of or consumed current increase between the power sources Vdd1 and Vss1. Furthermore, it is possible to detect short-circuit failure occurring in the wirings 321 to 323. In an event that short circuit occurs between these wirings, an increased amount of current is consumed in the selector 222. This is detectable as electric potential variation of or consumed current increase between the power sources Vdd2 and Vss2.

Sixth Embodiment

FIG. 8 is a circuit diagram showing an example of test technique in accordance with a sixth embodiment of the present invention. A module 100F is different from the module 100F shown in the embodiment 5 in that the demultiplexers 121 and 221 are omitted and inverters 401 to 406 are added, and further in that the OR gate G1 is replaced with a selector 124 and a shift register 125 and the OR gate G2 is replaced with a selector 224 and a shift register 225.

It is assumed in this embodiment that the wirings 311 to 314 are disposed in this order. The inverters 401 to 404 are alternately provided with respect to these wirings 311 to 314. More specifically, the inverters 401 and 402, being located in the chip 101, invert the signals outputted from the selector 122 and give the inverted signals to the wirings 312 and 314, respectively. The inverters 403 and 404, being located in the chip 102, invert the signals transmitted via the wirings 312 and 314, respectively, and give the inverted signals to the internal logic circuit 21. According to this arrangement, presence of the inverters 401 to 404 does not change the logic of the signals given from the selector 122 to the internal logic circuit 21.

Furthermore, it is assumed in this embodiment that the wirings 321 to 323 are disposed in this order. The inverters 405 and 406 are provided in the wiring 322. More specifically, the inverter 405, being located in the chip 102, inverts the signal outputted from the selector 222 and gives the inverted signal to the wiring 322. The inverter 406, being located in the chip 101, inverts the signal transmitted via the wiring 322 and gives the inverted signal to the internal logic circuit 11. According to this arrangement, presence of the inverters 405 and 406 does not change the logic of the signals given from the selector 222 to the internal logic circuit 11.

Like the OR gate G2 (refer to FIG. 7), the selector 224 inputs the signals given to the wirings 311 to 314. However, the selector 224 is connected to the wirings 312 and 314 through the inverters 403 and 404, respectively. Thus, the selector 224 inputs the outputs of inverters 403 and 404.

Like the OR gate G1 (refer to FIG. 7), the selector 124 inputs the signals given to the wirings 321 to 323. However, the inverter 406 interposes between the selector 124 and the wiring 322. Thus, the selector 124 inputs the output of inverter 406.

The test signal TDI is given to all of the wirings 151 to 154. Accordingly, each of the signals constituting one input group of selector 122 is the test signal TDI. The output of selector 224 is given to all of the wirings 251 to 253. Accordingly, each of the signals constituting one input group of selector 222 is the output of selector 224.

The shift register 225 inputs the output of selector 224. The output of selector 224 is selected from four inputs of selector 224 based on the output of the shift register 225.

Figure 9:
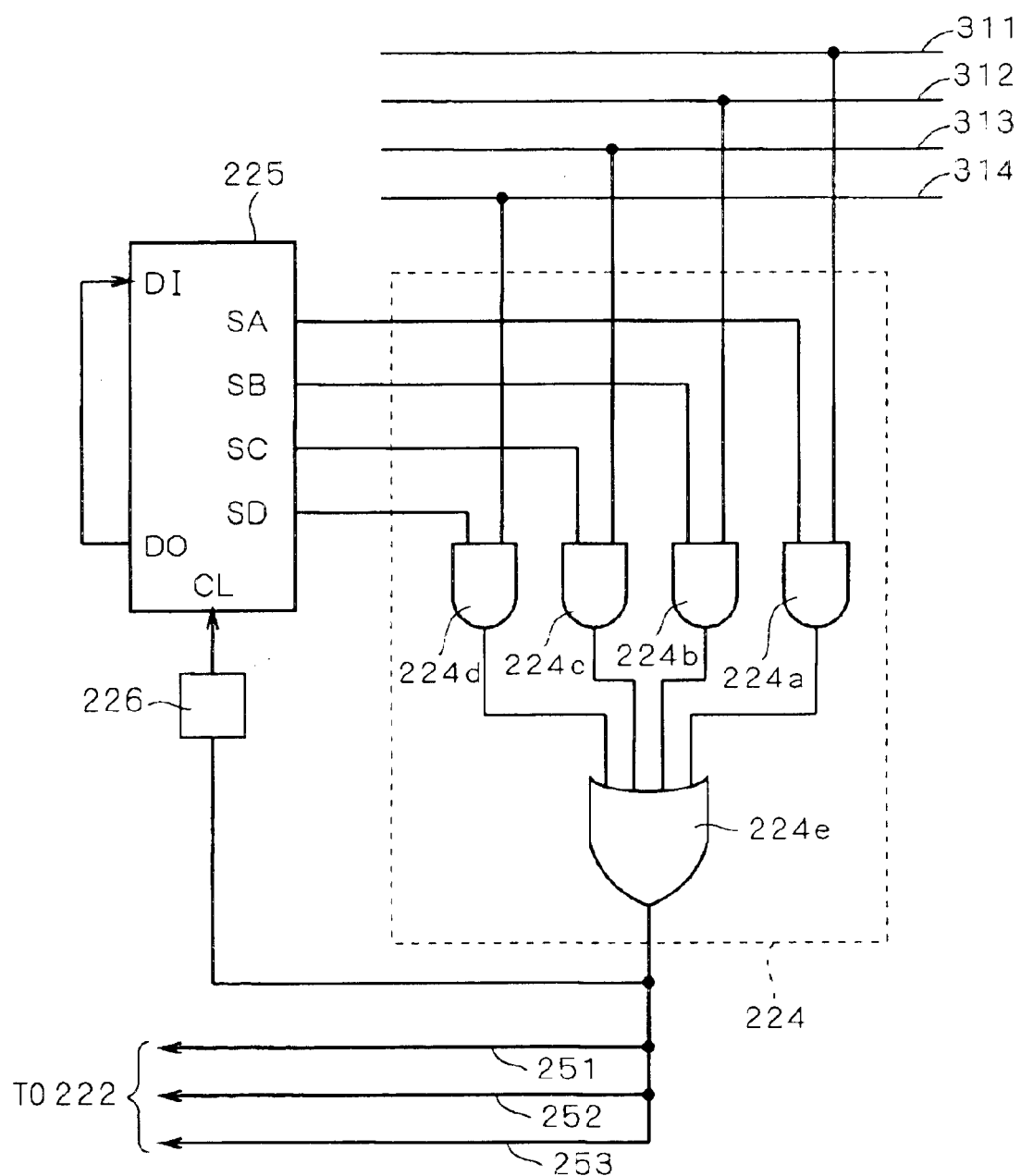
FIGS. 9 through 12 are circuit diagrams showing practical arrangements of a shift register and a selector.

FIG. 9 is a circuit diagram showing a practical arrangement of the shift register 225 and the selector 224. The shift register 225 has a clock terminal CL to which the output of selector 224 is given. Preferably, the output of selector 224 is given to the clock terminal CL of shift register 225 via a noise canceller 226.

The shift register 225 has a data input terminal DI which is directly connected to a data output terminal DO. In response to one-way transition of the logic of the signal given to the clock terminal CL, only one logic "H" and three logics "L" are outputted from the shift register 225 in such a manner that these logic outputs circulate among shift output terminals SA, SB, SC, and SD.

The selector 224 has AND gates 224a to 224d which are connected, via one of two input terminals thereof, to the shift output terminals SA, SB, SC, and SD of the shift register 225, respectively. The AND gates 224a to 224d are connected, via the other input terminal thereof, to the wirings 311 to 314, respectively. However, the other input terminal of AND gate 224b is given the output of the inverter 403 (refer to FIG. 8). The other input terminal of AND gate 224d is given the output of the inverter 404 (refer to FIG. 8).

The selector 224 further includes an OR gate 224e which outputs a logical sum of the outputs of AND gates 224a to 224d. An output of OR gate 224e is given as an output of selector 224 to the selector 222 as well as to the clock terminal CL of shift register 225.

The shift register 125 inputs the output of selector 124. The output of selector 124 is selected among three inputs of the selector 124 based on the output of shift register 125.

Figure 10:
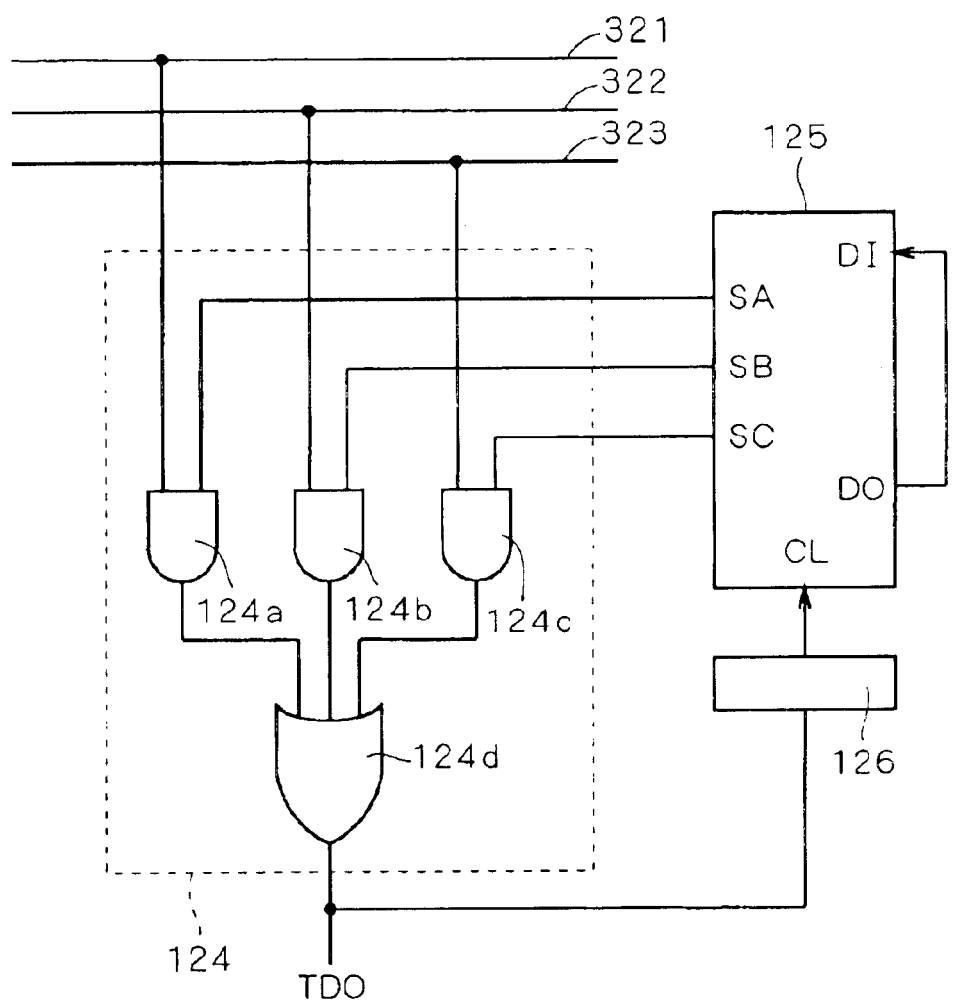

FIG. 10 is a circuit diagram showing a practical arrangement of the shift register 125 and the selector 124. The shift register 125 has a clock terminal CL to which the output of selector 124 is given. Preferably, the output of selector 124 is given to the clock terminal CL of shift register 125 via a noise canceller 126.

The shift register 125 has a data input terminal DI which is connected to a data output terminal DO. In response to one-way transition of the logic of the signal given to the clock terminal CL, only one logic "H" and two logics "L" are outputted from the shift register 125 in such a manner that these logic outputs circulate among shift output terminals SA, SB, and SC in this order.

The selector 124 has AND gates 124a to 124c which are connected, via one of two input terminals thereof, to the shift output terminals SA, SB, and SC of the shift register 125, respectively. The AND gates 124a to 124c are connected, via the other input terminal thereof, to the wirings 321 to 323, respectively. However, the other input terminal of AND gate 124b is given the output of the inverter 406 (refer to FIG. 8).

The selector 124 further includes an OR gate 124d which outputs a logical sum of the outputs of AND gates 124a to 124c. An output of OR gate 124d is given as an output of selector 124 to the clock terminal CL of shift register 125. Furthermore, the output of OR gate 124d serves as the detection signal TDO.

When the test mode select signal TMS is active, the test signal TDI is given to the other input terminals of respective AND gates 224a to 224d. When repetition of "H" and "L" is adopted as the logic of test signal TDI, output logic "H" is successively output from the shift output terminals SA to SD of shift register 225 in a circulation manner.

Similarly, when the test mode select signal TMS is active, the output of selector 224 is given to the other input terminals of respective AND gates 124a to 124c. When repetition of "H" and "L" is adopted as the logic of test signal TDI, output logic "H" is successively output from the shift output terminals SA to SC of shift register 125 in a circulation manner.

Under the condition that no breakage failure is present in the wirings 311 to 314, the output of selector 224e agrees with the test signal TDI and accordingly has the same logics of "H" and "L" irrespective of which of the shift output terminals SA to SD of shift register 225 outputs logic "H". Furthermore, under the condition that no breakage failure is present in the wirings 321 to 323, the output of selector 124e agrees with the test signal TDI and accordingly has the same logics of "H" and "L" irrespective of which of the shift output terminals SA to SC of shift register 125 outputs logic "H".

However, in the case that breakage failure is present for example in the wiring 312, the gate 224b cannot output "H" even if logic "H" is outputted from the shift output terminal SB. Accordingly, the output of selector 224e disagrees with the test signal TDI. Furthermore, even in a case that no breakage failure is present in the wirings 311 to 314, the detection signal TDO disagrees with the test signal TDI when breakage failure occurs in the wiring 322.

Accordingly, the presence of any breakage failure is detectable based on agreement or disagreement in a comparison between the transition of the logic of detection signal TDO and that of test signal TDI under the condition that transition of the logic of test signal TDI is repeated predetermined times (in this case, 12) equivalent to a least common multiple of the number of wirings 311 to 314 and the number of wirings 321 to 323.

Furthermore, providing the inverters 401 to 406 makes it possible to differentiate the logic of the signals transmitted via mutually adjacent wirings of the wirings 311 to 314 and 321 to 323. Accordingly, like the above-described third embodiment, the sixth embodiment can detect short-circuit failure occurring between adjacent wirings by measuring the presence of electric potential variation of or consumed current increase between the power sources Vdd1 and Vss1.

It is needless to say that the inverters 401 to 404 can be omitted in the case that detecting the short-circuit failure is unnecessary.

Seventh Embodiment

Figure 11:
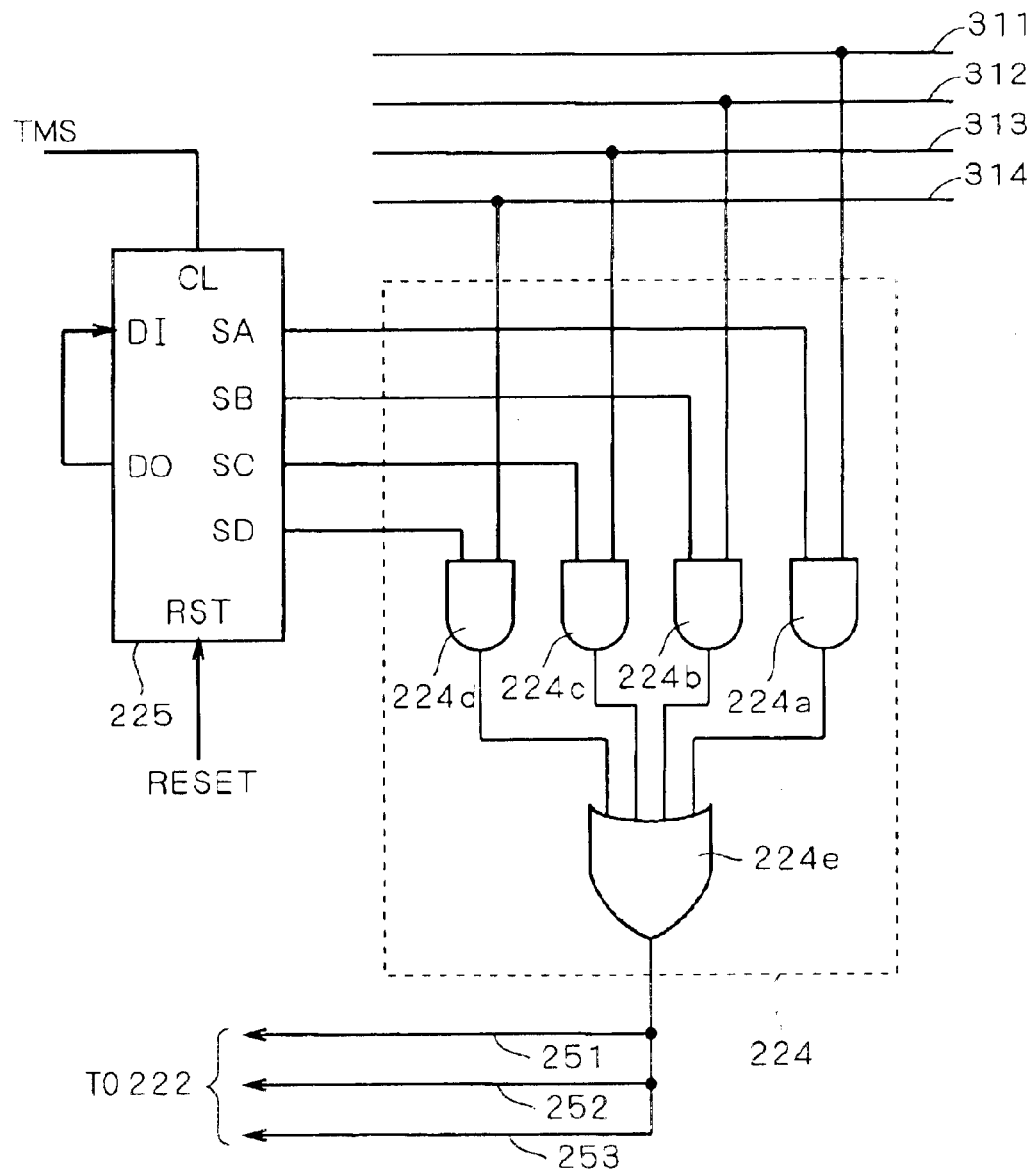
Figure 12:
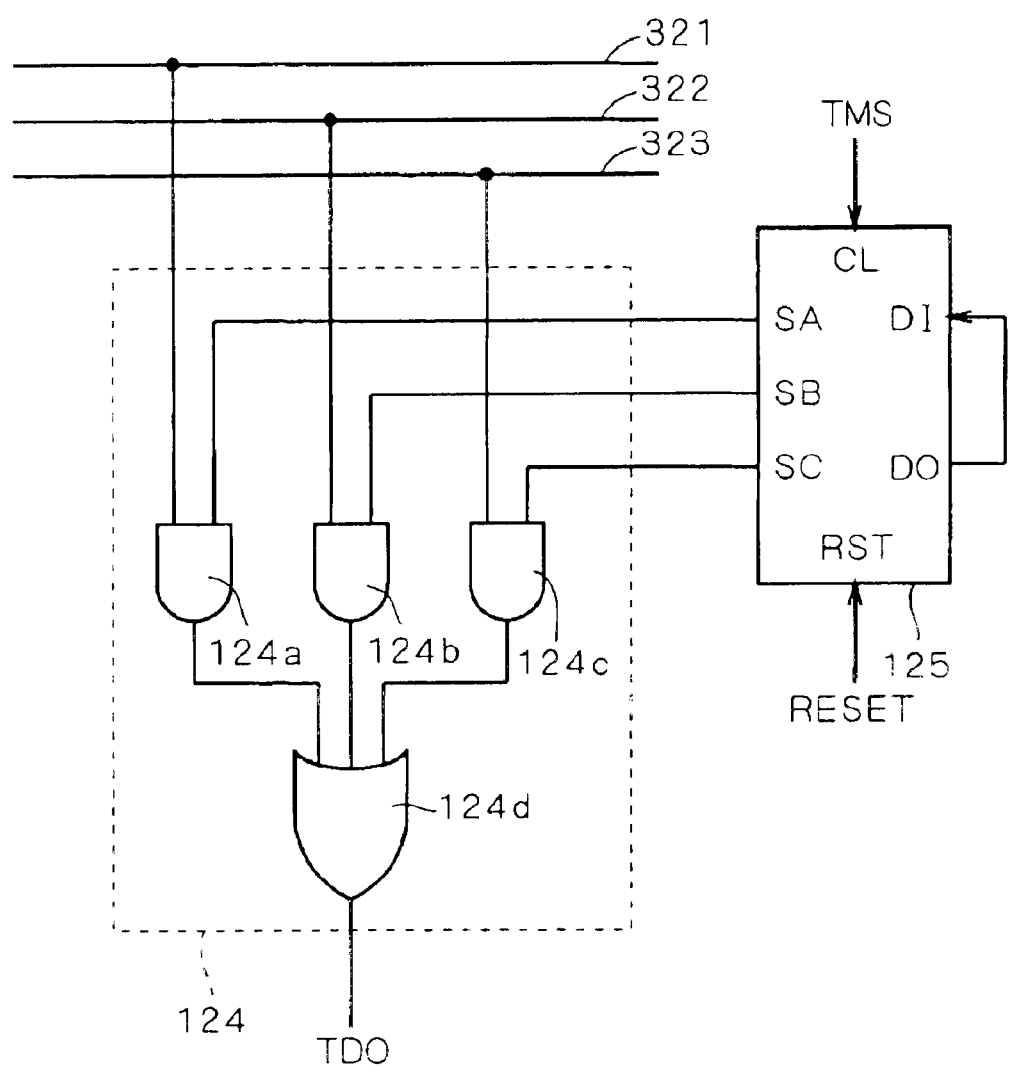

FIG. 11 is a circuit diagram showing another practical arrangement of the shift register 225 replaceable with that shown in the sixth embodiment. FIG. 12 is a circuit diagram showing another practical arrangement of the shift register 125 replaceable with that shown in the sixth embodiment.

Instead of the output of selector 224, the test mode signal TMS is entered into the clock terminal CL of shift register 225. Instead of the output of selector 124, the test mode signal TMS is entered into the clock terminal CL of shift register 125. Furthermore, a reset signal RESET is entered into a reset terminal RST of respective shift registers 125 and 225. The rest of the arrangement is similar to that of the sixth embodiment.

This embodiment uses transition of the logic of test mode signal TMS instead of using the transition of the logic of test signal TDI. First, the reset signal RESET is activated to output "H" from the shift output terminal SA of respective shift registers 125 and 225 and to output "L" from other shift output terminals. Then, in response to transition of the logic of test mode signal TMS, the shift output terminal producing "H" is successively changed among the shift output terminals SB, SC, SA, - - - in the shift register 124 and among the shift output terminals SB, SC, SD, SA, - - - in the shift register 224.

Accordingly, like the sixth embodiment, this embodiment can detect the presence of breakage failure based on agreement or disagreement in a comparison between the transition of the logic of detection signal TDO and that of test signal TDI.

While the invention has been shown and described in detail, the foregoing description is in all aspects illustrative and not restrictive. It is therefore understood that numerous other modifications and variations can be devised without departing from the scope of the invention.

What is claimed is:

1. A multichip module comprising a first chip, a second chip, and a first wiring and a second wiring each connecting said first chip and said second chip,
   wherein said first chip comprises:
   an internal circuit having an output terminal and an input terminal; and
   a selector having a first input terminal, a second input terminal connected to said output terminal of said internal circuit of said first chip, and an output terminal selectively outputting a signal given to said first input terminal or a signal given to said second input terminal,
   said second chip comprises:
   an internal circuit having an output terminal and an input terminal; and
   a selector having a first input terminal connected to said input terminal of said internal circuit of said second chip, a second input terminal connected to said output terminal of said internal circuit of said second chip, and an output terminal,
   said output terminal of said selector of said first chip is connected via said first wiring to said input terminal of said internal circuit of said second chip,
   said output terminal of said selector of said second chip is connected via said second wiring to said input terminal of said internal circuit of said first chip,
   said selector of said second chip outputs the signal given to the first input terminal thereof to the output terminal thereof when said selector of said first chip outputs the signal given to the first input terminal thereof to the output terminal thereof, and
   said selector of said second chip outputs the signal given to the second input terminal thereof to the output terminal thereof when said selector of said first chip outputs the signal given to the second input terminal thereof to the output terminal thereof.

2. The multichip module according to claim 1, further comprising a driver giving a test signal to said input terminal of said selector of said first chip.

3. The multichip module according to claim 1, wherein a test mode select signal for controlling operations of said selector of said first chip and said selector of said second chip is given to said first chip and to said second chip.

4. The multichip module according to claim 1, further comprising an inverter provided immediately in front of said first input terminal of said selector of said second chip.

5. The multichip module according to claim 4, further comprising a driver giving a test signal to said input terminal of said selector of said first chip.

6. The multichip module according to claim 4, wherein a test mode select signal for controlling operations of said selector of said first chip and said selector of said second chip is given to said first chip and to said second chip.

7. A multichip module comprising a first chip, a second chip, and a plurality of wirings each connecting said first chip and said second chip,
   wherein said first chip comprises:
   an internal circuit outputting an output signal group consisting of a plurality of output signals; and
   an input buffer and an output buffer provided for each of said plurality of wirings,
   said second chip comprises:
   an input buffer and an output buffer provided for each of said plurality of wirings,
   each of respective output buffers of said first chip operates under a power voltage obtained as a potential difference between a first power source and a second power source, has an output terminal connected to one end of a corresponding one of said plurality of wirings, and an input terminal to which either a corresponding one of said plurality of output signals or a test signal is given,
   each of respective input buffers of said first chip has an input terminal connected to said one end of said corresponding one of said plurality of wirings,
   each of respective output buffers of said second chip operates under a power voltage obtained as a potential difference between a third power source and a fourth power source, and has an output terminal connected to the other end of said corresponding one of said plurality of wirings and brought into a condition insulated from said output buffer of said second chip when said output buffer of said second chip is inactive,
   each of respective input buffers of said second chip has an input terminal connected to the other end of said corresponding one of said plurality of wirings, and
   a logic of only one test signal is different from logics of other test signals.

8. The multichip module according to claim 7, wherein an electric potential of said second power source is equal to an electric potential of said fourth power source, and an electric potential of said third power source approaches to an electric potential of said second power source than an electric potential of said first power source when said output buffer is inactive.

9. The multichip module according to claim 7, further comprising:
   a plurality of shift registers provided for each of said plurality of wirings for sequentially transmitting said test signals, and
   a selector for selectively supplying outputs of said plurality of shift registers or said output signal group to said input terminals of said plurality of output buffers of said first chip.

10. The multichip module according to claim 7, wherein said internal circuit outputs said test signal.

11. A multichip module comprising a first chip, a second chip, a plurality of first wirings for transmitting signals from said first chip to said second chip, and a plurality of second wirings for transmitting signals from said second chip to said first chip,
    wherein said first chip comprises:
    an internal circuit;
    a first wiring group to which an output of said internal circuit of said first chip is given;

a second wiring group;

a demultiplexer which inputs a test signal and gives said test signal to any one wiring of said second wiring group of said first chip based on a control signal;

a selector for outputting a signal given to said first wiring group of said first chip or a signal given to said second wiring group of said first chip to said plurality of first wirings; and a logic gate for executing a logical operation for the signals given to said plurality of second wirings, said second chip comprises:

an internal circuit;

a logic gate for executing a logical operation for the signals given to said plurality of first wirings;

a first wiring group to which an output of said internal circuit of said second chip is given;

a second wiring group;

a demultiplexer which inputs an output of said logic gate of said second chip and gives said output of said logic gate of said second chip to any one wiring of said second wiring group of said second chip based on said control signal; and a selector for outputting a signal given to said first wiring group of said second chip or a signal given to said second wiring group of said second chip to said plurality of second wirings, said selector of said second chip outputs the signal given to said first wiring group of said second chip to said plurality of second wirings when said selector of said first chip outputs the signal given to said first wiring group of said first chip to said plurality of first wirings, said selector of said second chip outputs the signal given to said second wiring group of said second chip to said plurality of second wirings when said selector of said first chip outputs the signal given to said second wiring group of said first chip to said plurality of first wirings, and each of the logic gate of said first chip and the logic gate of said second chip checks whether or not their inputs agree with each other.

12. The multichip module according to claim 11, wherein a test mode select signal for controlling operations of said selector of said first chip and said selector of said second chip is given to said first chip and to said second chip.

13. A multichip module comprising a first chip, a second chip, a plurality of first wirings for transmitting signals from said first chip to said second chip, and a plurality of second wirings for transmitting signals from said second chip to said first chip, wherein said first chip comprises:

an internal circuit;

a first wiring group to which an output of said internal circuit of said first chip is given;

a second wiring group consisting of a plurality of wirings to which a test signal is given;

a first selector for outputting a signal given to said first wiring group of said first chip or a signal given to said second wiring group of said first chip to said plurality of first wirings; and a second selector for outputting any one of signals given to said plurality of second wirings, said second chip comprises:

an internal circuit;

a first selector for outputting any one of signals given to said plurality of first wirings, a first wiring group to which an output of said internal circuit of said second chip is given;

a second wiring group consisting of a plurality of wirings to which the output of said selector of said second chip is given; and a second selector for outputting a signal given to said first wiring group of said second chip or a signal given to said second wiring group of said second chip to said plurality of second wirings, said second selector of said second chip outputs the signal given to said first wiring group of said second chip to said plurality of second wirings when said first selector of said first chip outputs the signal given to said first wiring group of said first chip to said plurality of first wirings, and said second selector of said second chip outputs the signal given to said second wiring group of said second chip to said plurality of second wirings when said first selector of said first chip outputs the signal given to said second wiring group of said first chip to said plurality of first wirings.

14. The multichip module according to claim 13, wherein a test mode select signal for controlling operations of said first selector of said first chip and said second selector of said second chip is given to said first chip and to said second chip.

15. The multichip module according to claim 13, wherein said first chip further comprises a shift register for inputting the output of said second selector of said first chip, and said second selector of said first chip outputs depending on an output of said shift register of said first chip.

16. The multichip module according to claim 13, wherein said second chip further comprises a shift register for inputting the output of said first selector of said second chip, and said first selector of said second chip outputs depending on an output of said shift register of said second chip.

17. The multichip module according to claim 13, further comprising a first inverter and a second inverter intervening in one wiring of said plurality of first wirings, wherein said first inverter and said second inverter are provided in said first chip and said second chip respectively, and said first selector of said second chip is connected via said second inverter to said one wiring.

18. The multichip module according to claim 13, further comprising a first inverter and a second inverter intervening in one wiring of said plurality of second wirings, wherein said first inverter and said second inverter are provided in said second chip and said first chip respectively, and said second selector of said first chip is connected via said second inverter to said one wiring.

19. The multichip module according to claim 17, further comprising a first inverter and a second inverter intervening in one wiring of said plurality of second wirings, wherein said first inverter and said second inverter are provided in said second chip and said first chip respectively, and said second selector of said first chip is connected via said second inverter to said one wiring of said plurality of said second wirings.

* * * * *